(12) United States Patent
Chen et al.

(10) Patent No.: US 10,871,186 B1
(45) Date of Patent: Dec. 22, 2020

(54) SLIDE RAIL MECHANISM

(71) Applicants: KING SLIDE WORKS CO., LTD., Kaohsiung (TW); KING SLIDE TECHNOLOGY CO.,LTD., Kaohsiung (TW)

(72) Inventors: Ken-Ching Chen, Kaohsiung (TW); Shun-Ho Yang, Kaohsiung (TW); Shang-Huang Chen, Kaohsiung (TW); Chun-Chiang Wang, Kaohsiung (TW)

(73) Assignees: KING SLIDE WORKS CO., LTD., Kaohsiung (TW); KING SLIDE TECHNOLOGY CO., LTD., Kaohsiung (TW)

( * ) Notice: Subject to any disclaimer, the term of this patent is extended or adjusted under 35 U.S.C. 154(b) by 0 days.

(21) Appl. No.: 16/592,776

(22) Filed: Oct. 4, 2019

(30) Foreign Application Priority Data

Jul. 29, 2019 (TW) ............................. 108127109 A

(51) Int. Cl.
*F16C 29/02* (2006.01)
*A47B 88/43* (2017.01)

(52) U.S. Cl.
CPC .............. *F16C 29/02* (2013.01); *A47B 88/43* (2017.01)

(58) Field of Classification Search
CPC ....... A47B 88/43; A47B 88/49; A47B 88/493; F16C 29/02; F16C 29/04; F16C 29/048
See application file for complete search history.

(56) References Cited

U.S. PATENT DOCUMENTS

| | | | |
|---|---|---|---|
| 6,230,903 B1 | 5/2001 | Abbott | |
| 8,028,965 B2 | 10/2011 | Chen | |
| 9,328,769 B1 | 5/2016 | Chen | |
| 9,545,153 B2* | 1/2017 | Chen | A47B 88/43 |
| 2016/0235196 A1* | 8/2016 | Chen | A47B 88/493 |
| 2018/0140092 A1* | 5/2018 | Chen | A47B 88/493 |
| 2018/0368278 A1* | 12/2018 | Chen | A47B 88/43 |

FOREIGN PATENT DOCUMENTS

| | | |
|---|---|---|
| CN | 101721057 A | 6/2010 |
| CN | 104507297 | 4/2015 |
| CN | 205356912 U | 6/2016 |
| CN | 205378453 U | 7/2016 |
| CN | 106604596 A | 4/2017 |
| CN | 108337852 A | 7/2018 |
| TW | I481364 B | 4/2015 |

* cited by examiner

*Primary Examiner* — Phillip A Johnson
(74) *Attorney, Agent, or Firm* — Winston Hsu

(57) ABSTRACT

A slide rail mechanism includes a rail member, a reinforcing member and a bracket. The reinforcing member is connected to the rail member. The bracket is movable along a length direction of the rail member and the reinforcing member. The bracket, the rail member and the reinforcing member are able to support each other when the bracket is moved to an arbitrary position.

16 Claims, 7 Drawing Sheets

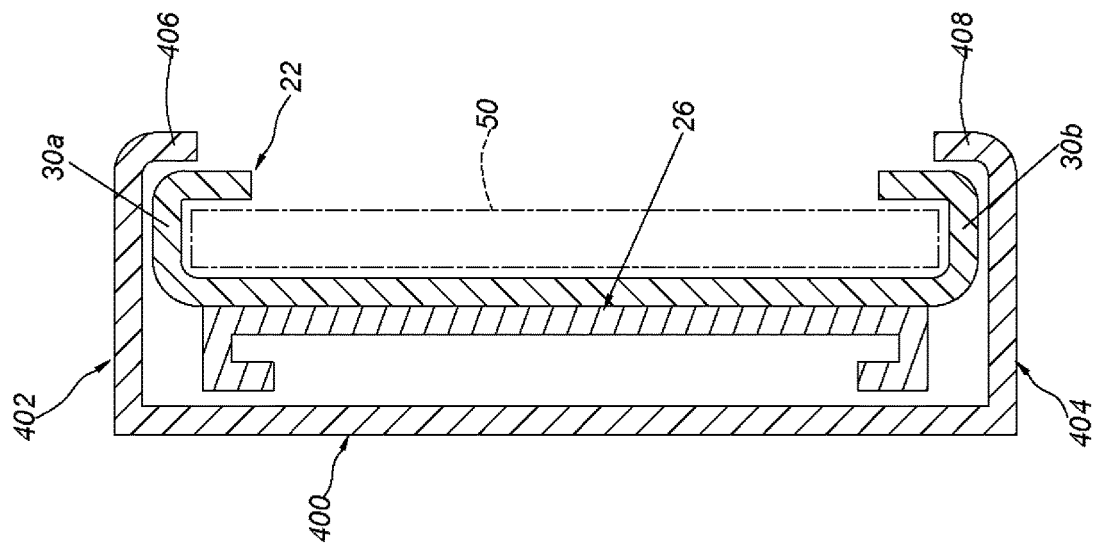
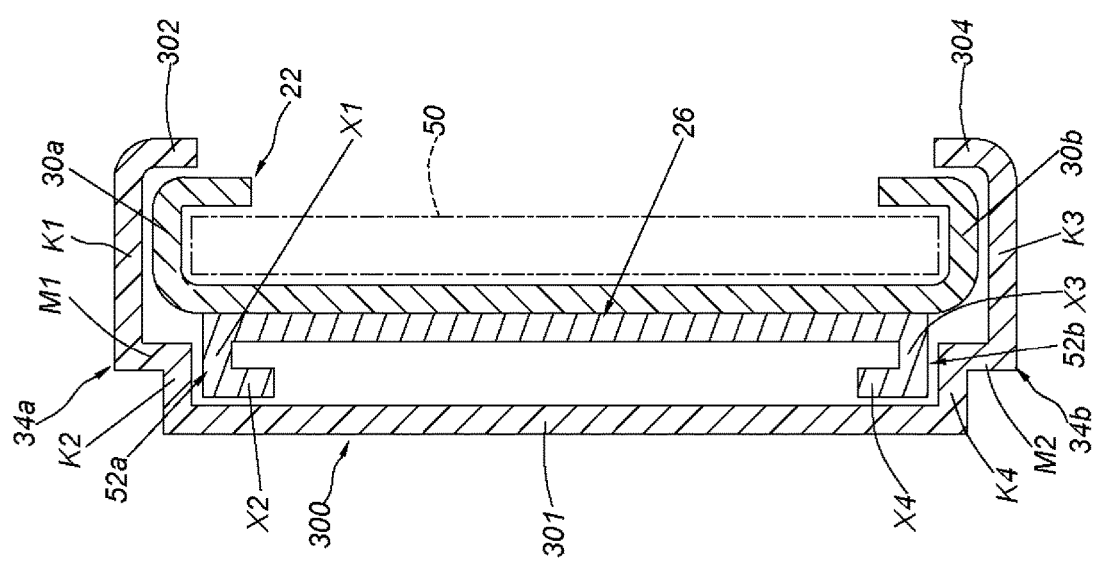

SLIDE RAIL MECHANISM

BACKGROUND OF THE INVENTION

1. Field of the Invention

The present invention relates to a slide rail mechanism, and more particularly, to a slide rail mechanism with a bracket.

2. Description of the Prior Art

U.S. Pat. No. 6,230,903 B1 discloses a rack system. Wherein, a first mounting bracket and a second mounting bracket are slidably attached on a first end and a second end of a rail member (an outer rail) respectively.

U.S. Pat. No. 8,028,965 B2 discloses an adjustable bracket of a slide rail assembly. Wherein, a fix base is fixedly arranged on an outer rail, and a bracket is slidably mounted in a passage of the fix base.

U.S. Pat. No. 9,328,769 B1 discloses a bracket device of a slide rail assembly including a rail member (an outer rail), a first supporting frame, a second supporting frame, a third supporting frame and a mounting bracket. Wherein, the first supporting frame is fixedly arranged on the rail member. The second supporting frame, the third supporting frame and the mounting bracket are movable, stretchable and retractable relative to the first supporting frame. In addition, the mounting bracket can be adjusted to be located at a first position relative to the rail member according to user's requirement (as shown in FIG. 5 of the US patent), or be located at a second position (as shown in FIG. 7 of the US patent). Furthermore, when the mounting bracket is located at the first position relative to the rail member, the mounting bracket is able to partially clad the rail member and the first supporting frame. However, when the mounting bracket is located at the second position relative to the rail member, the mounting bracket does not clad any part of the first supporting frame (although the mounting bracket partially clads the rail member).

China patent number 104507297 B discloses a slide rail frame including a front frame and a rear frame. The front frame is fixedly mounted on a rail member (an outer rail). Wherein, the rear frame is movably arranged in a sliding slot of the front frame.

China patent number 205378453 U discloses a reinforced rear frame structure of a slide rail. The reinforced rear frame structure includes a rail member, a fixing frame and a sliding frame. Wherein the fixing frame is fixedly mounted on a rear portion of the rail member, and the fixing frame is embedded in the sliding frame.

China patent number 205356912 U discloses a slide rail frame including a rail member, a front frame and a rear frame. The front frame is fixedly arranged on the rail member, and the front frame penetrates into a passage of the rear frame.

Although the above related patents have disclosed the slide rails and the brackets (or frames), as requirement of market for the load capacity of a slide rail increasing, how to improve the structural strength between the slide rail and the bracket has become an issue.

SUMMARY OF THE INVENTION

The present invention provides a slide rail mechanism having a bracket.

According to an embodiment of the present invention, a slide rail mechanism includes a rail member, a first bracket and a reinforcing member. The first bracket is movable relative to the rail member. The reinforcing member is arranged between the rail member and the first bracket. Wherein, the first bracket, the rail member and the reinforcing member support each other when the first bracket is moved to an arbitrary position.

Preferably, the first bracket is arranged adjacent to a first end portion of the rail member, the first bracket includes a first mounting portion, the slide rail mechanism further includes a second bracket arranged adjacent to a second end portion of the rail member, the second bracket includes a second mounting portion, the first mounting portion of the first bracket is configured to mount the rail member to a first post, the second mounting portion of the second bracket is configured to mount the rail member to a second post.

Preferably, the rail member has a first side and a second side, the reinforcing member is connected to the first side, the slide rail mechanism further includes at least one moving rail movably mounted on the second rail.

Preferably, the rail member includes a first rail portion, a second rail portion and a longitudinal body connected between the first rail portion and the second rail portion, the first bracket includes a first supporting portion, a second supporting portion and a longitudinal supporting portion connected between the first supporting portion and the second supporting portion, the reinforcing member includes a first wall portion, a second wall portion and a longitudinal wall connected between the first wall portion and the second wall portion.

Preferably, the longitudinal supporting portion of the first bracket further includes a first extension portion, the longitudinal supporting portion and one of the first wall portion and the second wall portion of the reinforcing member are able to support each other.

Preferably, the longitudinal supporting portion of the first bracket further includes a second extension portion, the second extension portion and the other one of the first wall portion and the second wall portion of the reinforcing member are able to support each other.

Preferably, the first wall portion of the reinforcing member includes a first wall section and a second wall section bent relative to the first wall section, a space is defined by the first wall section and the second wall section, the first extension portion of the first bracket includes a first extension section and a second extension section bent relative to the first extension section, the second extension section is extended into the space of first wall portion, the second wall portion of the reinforcing member includes a third wall section and a fourth wall section bent relative to the third wall section, a space is defined by the third wall section and the fourth wall section, the second extension portion of the first bracket includes a third extension section and a fourth extension section bent relative to the third extension section, the fourth extension section is extended into the space of the second wall portion.

Preferably, the first supporting portion of the first bracket includes a first supporting section, a second supporting section and a first intermediate section connected between the first supporting section and the second supporting section, the first supporting section of the first bracket and the first rail portion of the rail member are able to support each other, the second supporting section of the first bracket and the first wall portion of the reinforcing member are able to support each other, the second supporting portion of the first bracket includes a third supporting section, a fourth supporting section and a second intermediate section connected between the third supporting section and the fourth supporting section, the third supporting section of the first bracket and the second rail portion of the rail member are able to support each other, the fourth supporting section of the first bracket and the second wall portion of the reinforcing member are able to support each other.

Preferably, the first supporting portion of the first bracket further includes a first bending section, the first bending section and a side of the first rail portion of the rail member are able to support each other.

Preferably, the second supporting portion of the first bracket further includes a second bending section, the second bending section and a side of the second rail portion of the rail member are able to support each other.

Preferably, the first wall portion of the reinforcing member includes a first wall section and a second wall section bent relative to the first wall section, the second wall portion of the reinforcing member includes a third wall section and a fourth wall section bent relative to the third wall section.

Preferably, the first supporting portion of the first bracket includes a first supporting section, a second supporting section and a first intermediate section connected between the first supporting section and the second supporting section, the first supporting section of the first bracket and the first rail portion of the rail member are able to support each other, the second supporting section of the first bracket and the first wall portion of the reinforcing member are able to support each other.

Preferably, the second supporting portion of the first bracket include a third supporting section, a fourth supporting section and a second intermediate section connected between the third supporting section and the fourth supporting section, the third supporting section of the first bracket and the second rail portion of the rail member are able to support each other, the fourth supporting section of the first bracket and the second wall portion of the reinforcing member are able to support each other.

Preferably, the first supporting portion the first bracket further includes a first bending section, the first bending section and a side of the first rail portion of the rail member are able to support each other, the second supporting portion of the first bracket further includes a second bending section, the second bending section and a side of the second rail portion of the rail member are able to support each other.

Preferably, the first wall portion of the reinforcing member includes a first wall section and a second wall section bent relative to the first wall section, a space is defined by the first wall section and the second wall section, the second wall portion of the reinforcing member includes a third wall section and a fourth wall section bent relative to the third wall section, a space is defined by the third wall section and the fourth wall section.

Preferably, the first supporting portion of the first bracket includes a first supporting section, a second supporting section and a plurality of first intermediate sections connected between the first supporting section and the second supporting section, the first supporting section of the first bracket and the first rail portion of the rail member are able to support each other, the second supporting section of the first bracket and the first wall portion of the reinforcing member are able to support each other, the plurality of first intermediate sections are extended into the space of the first wall portion of the reinforcing member.

Preferably, the second supporting portion of the first bracket includes a third supporting section, a fourth supporting section and a plurality of second intermediate sections connected between the third supporting section and the fourth supporting section, the third supporting section of the first bracket and the second rail portion of the rail member are able to support each other, the fourth supporting section of the first bracket and the second wall portion of the reinforcing member are able to support each other, the plurality of second intermediate sections are extended into the space of the second wall portion of the reinforcing member.

Preferably, the first supporting portion of the first bracket further includes a first bending section, the first bending section and a lateral side of the first rail portion of the rail member are able to support each other, the second supporting portion of the first bracket further includes a second bending section, the second bending section and a lateral side of the second rail portion of the rail member are able to support each other.

According to another embodiment of the present invention, a slide rail mechanism includes a rail member, a reinforcing member, a first bracket and a second bracket. The rail member includes a first rail portion, a second rail portion and a longitudinal body connected between the first rail portion and the second rail portion. A passage is defined by the first rail portion, the second rail portion and the longitudinal body. Wherein, the longitudinal body has a first side and a second side. The first side is located out of the passage. The second side is located in the passage. The reinforcing member is fixedly arranged on the first side of the rail member, the reinforcing member is configured to improve strength of the rail member. The first bracket includes a first mounting portion, the first bracket movably mounted on one of the rail member and the reinforcing member. The first bracket includes a first supporting portion, a second supporting portion and a longitudinal supporting portion connected between the first supporting portion and the second supporting portion. The second bracket includes a second mounting portion. The second mounting portion is arranged corresponding to the first mounting portion. The second bracket is arranged on one of the rail member and the reinforcing member. Wherein, when the first bracket is moved to an arbitrary position, the first supporting portion of the first bracket and the first rail portion of the rail member are able to support each other. The second supporting portion of the first bracket and the second rail portion of the rail member are able to support each other. The reinforcing member, the longitudinal supporting portion of the first bracket and the longitudinal body of the rail member are able to support each other.

According to yet another embodiment of the present invention, a slide rail mechanism includes a rail member, a reinforcing member and a first bracket. The reinforcing member is connected to the rail member. The first bracket is movable along a length direction of the rail member and the reinforcing member. Wherein, when the first bracket is moved to an arbitrary position, the first bracket partially clad the rail member and the reinforcing member. The first bracket and at least one of the rail member and the reinforcing member are able to support each other.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 7 is a cross-sectional view illustrating a rail member, a reinforcing member and a first bracket of a slide rail mechanism according to a third embodiment of the present invention.

FIG. 8 is a cross-sectional view illustrating a rail member, a reinforcing member and a first bracket of a slide rail mechanism according to a fourth embodiment of the present invention.

DETAILED DESCRIPTION

Figure 1:
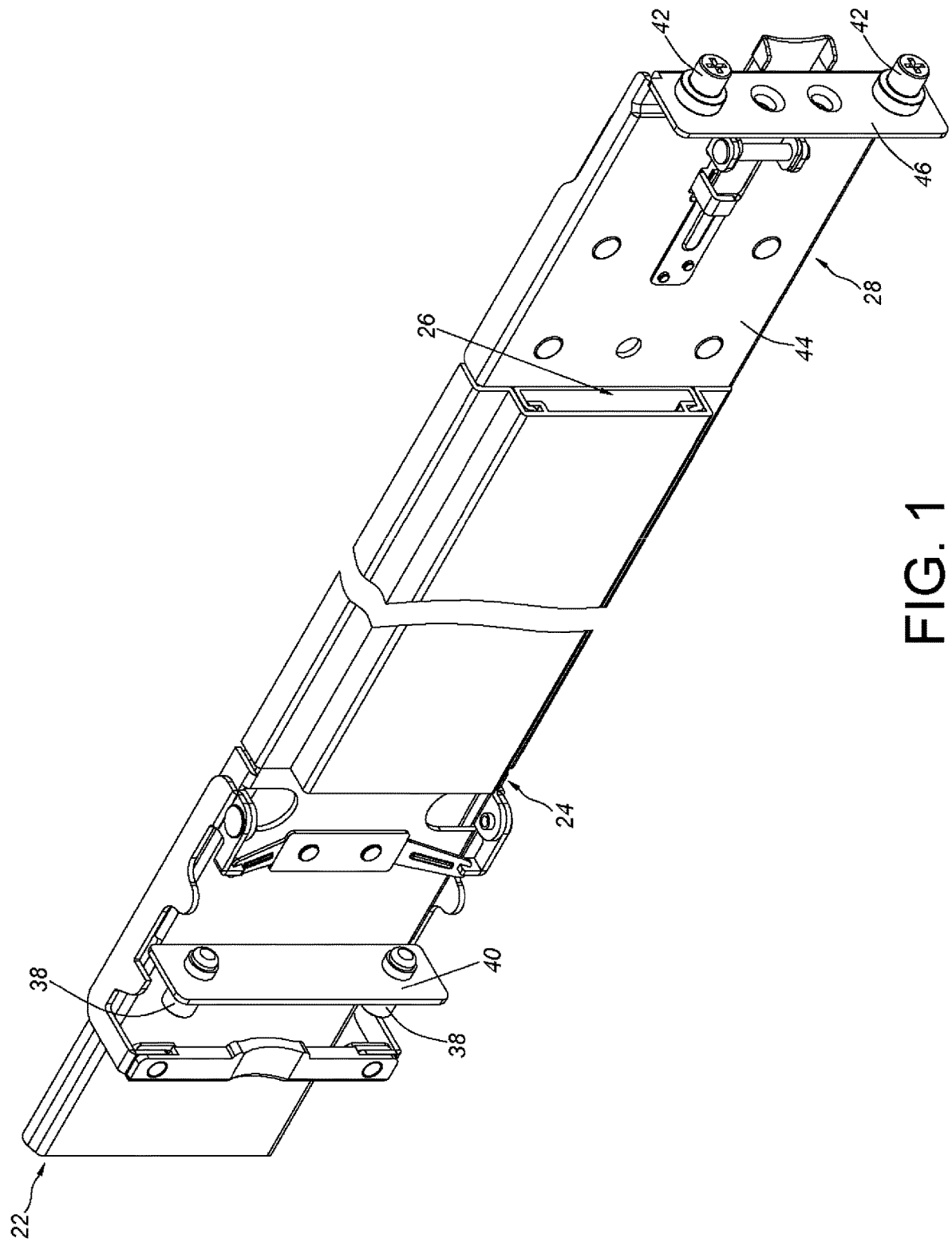
FIG. 1 is a schematic diagram illustrating a slide rail mechanism according to a first embodiment of the present invention.
Figure 2:
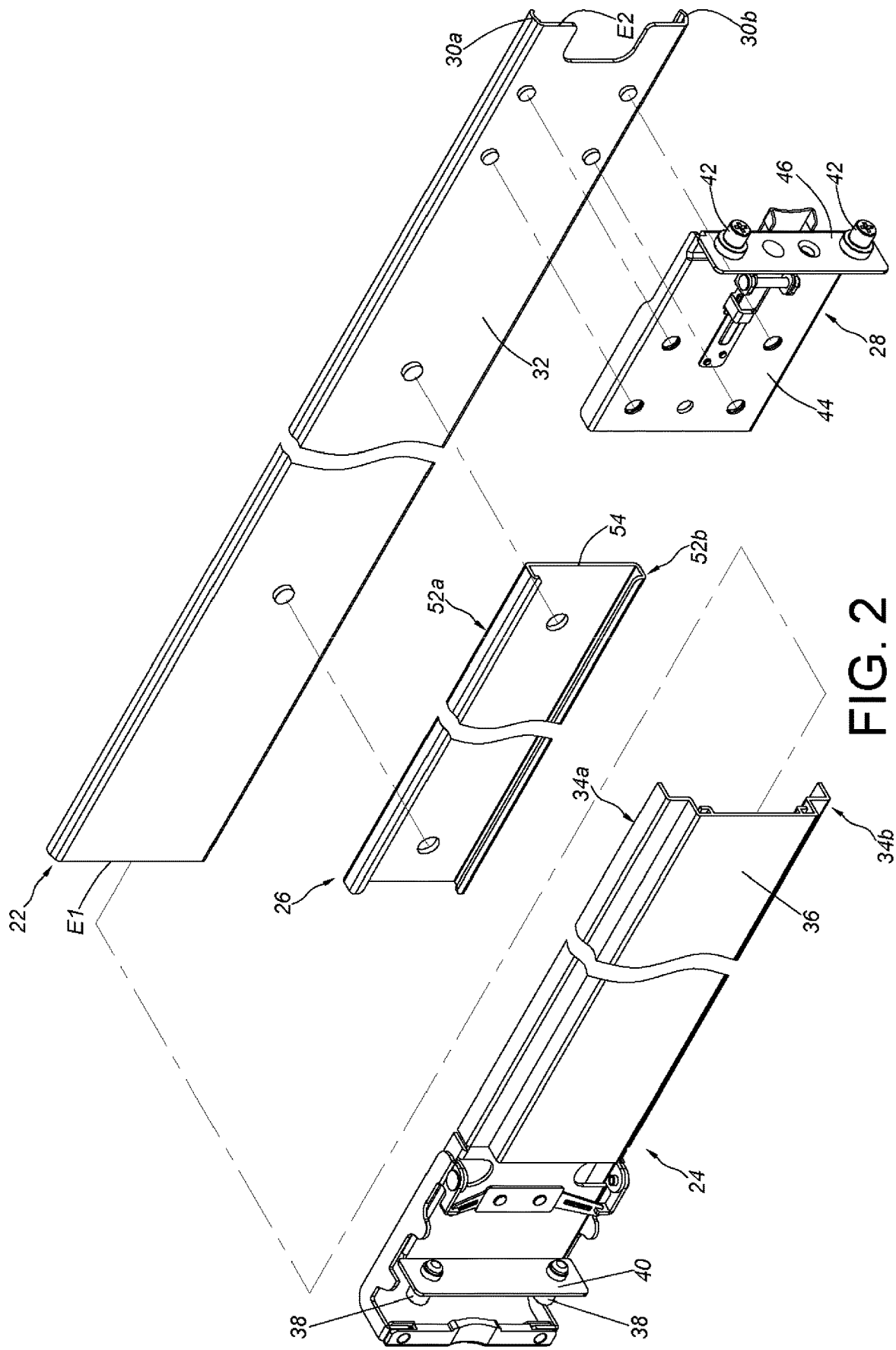
FIG. 2 is an exploded view illustrating the slide rail mechanism according to the first embodiment of the present invention.

As shown in FIG. 1 and FIG. 2, a slide rail mechanism according to a first embodiment of the present invention includes a rail member 22, a first bracket 24 and a reinforcing member 26. Preferably, the slide rail mechanism further includes a second bracket 28.

The rail member 22 includes a first rail portion 30a, a second rail portion 30b and a longitudinal body 32 connected between the first rail portion 30a and the second rail portion 30b. Preferably, the first rail portion 30a and the second rail portion 30b are laterally extended from the longitudinal body 32.

The first bracket 24 is movably arranged on one of the rail member 22 and the reinforcing member 26. For example, the first bracket 24 is movably arranged on the rail member 22. Alternatively, the first bracket 24 is movably arranged on the reinforcing member 26, or the first bracket 24 is movably arranged on the rail member 22 and the reinforcing member 26. The present invention is not limited thereto.

Furthermore, the first bracket 24 is movable and a position of the first bracket 24 relative to the rail member 22 can be adjusted. The first bracket 24 is arranged adjacent to a first end portion E1 of the rail member 22. The first bracket 24 includes a first supporting portion 34a, a second supporting portion 34b and a longitudinal supporting portion 36 connected between the first supporting portion 34a and the second supporting portion 34b. Preferably, the first bracket 24 includes at least one first mounting portion 38. For example, the first bracket 24 includes an end wall 40 bent relative to the longitudinal supporting portion 36. Preferably, the end wall 40 is substantially bent vertically relative to the longitudinal supporting portion 36, but the present invention is not limited thereto. Wherein, the at least one first mounting portion 38 is arranged on the end wall 40. It is noticed that there are two first mounting portions 38 according to the embodiment of the present invention in FIG. 2, but the present invention is not limited thereto. For example, the first bracket 24 can include just one first mounting portion 38. The number of the first mounting portion 38 depends on specific requirements.

The reinforcing member 26 is arranged between the rail member 22 and the first bracket 24. Furthermore, the reinforcing member 26 is connected to the rail member 22 and can be regarded as a part of the rail member 22. Preferably, the reinforcing member 26 is fixedly arranged on the longitudinal body 32 of the rail member 22.

The second bracket 28 is arranged on one of the rail member 22 and the reinforcing member 26. For example, the second bracket 28 is able to be arranged on the rail member 22. Alternatively, since the reinforcing member 26 can be regarded as a part of the rail member 22, the location of the reinforcing member 26 can be extended to the second bracket 28 specifically, such that the second bracket 28 is able to be arranged on the reinforcing member 26, but the present invention is not limited thereto.

In the present embodiment, the second bracket 28 is arranged adjacent to a second end portion E2 of the rail member 22, and is arranged far from the first end portion E1. The second bracket 28 is fixedly arranged adjacent to the second end portion E2 of the rail member 22. Preferably, the second bracket 28 includes at least one second mounting portion 42. The at least one second mounting portion 42 is arranged corresponding to the at least one first mounting portion 38. For example, the second bracket 28 includes a longitudinal supporting wall 44 and an end plate 46 bent relative to the longitudinal supporting wall 44. Preferably, the end plate 46 is substantially bent vertically relative to the longitudinal supporting wall 44, but the present invention is not limited thereto. Wherein, the at least one second mounting portion 42 is arranged on the end plate 46. In addition, there are two second mounting portions 42 according to the embodiment of the present invention in FIG. 2, but the present invention is not limited thereto. For example, the second bracket 28 can include just one second mounting portion 42. The number of the second mounting portion 42 depends on specific requirements.

Figure 3:
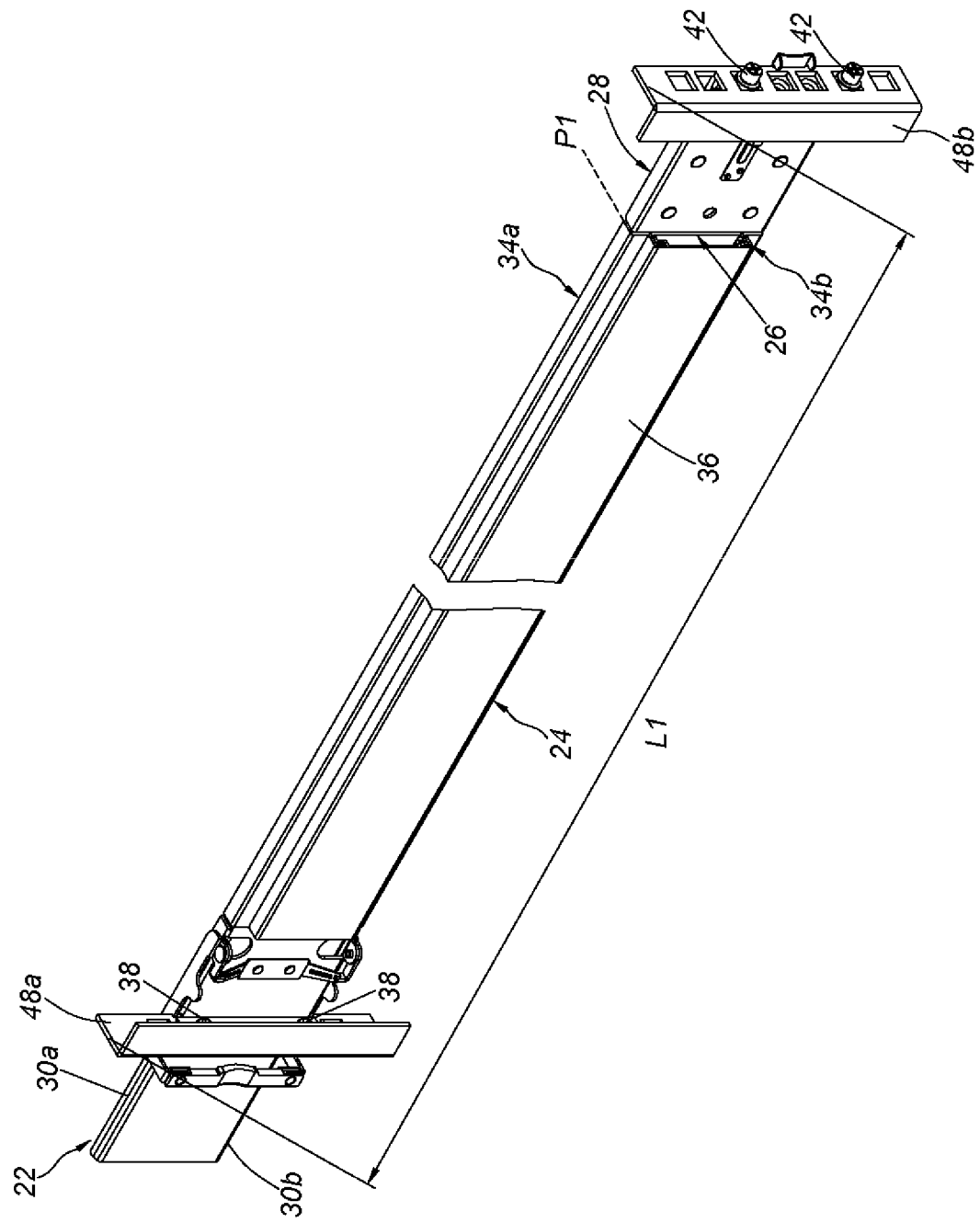
FIG. 3 is a diagram illustrating the slide rail mechanism being mounted on a rack with a first gap according to the first embodiment of the present invention.

As shown in FIG. 3, the at least one first mounting portion 38 of the first bracket 24 is configured to mount the rail member 22 to a first post 48a of a rack. The at least one second mounting portion 42 of the second bracket 28 is configured to mount the rail member 22 to a second post 48b of the rack. Wherein, the first bracket 24 is able to be moved to a first position P1 relative to the rail member 22, such that a first distance is formed between the first bracket 24 and the second bracket 28, in order to correspond to a first gap L1 between the first post 48a and the second post 48b.

Figure 4:
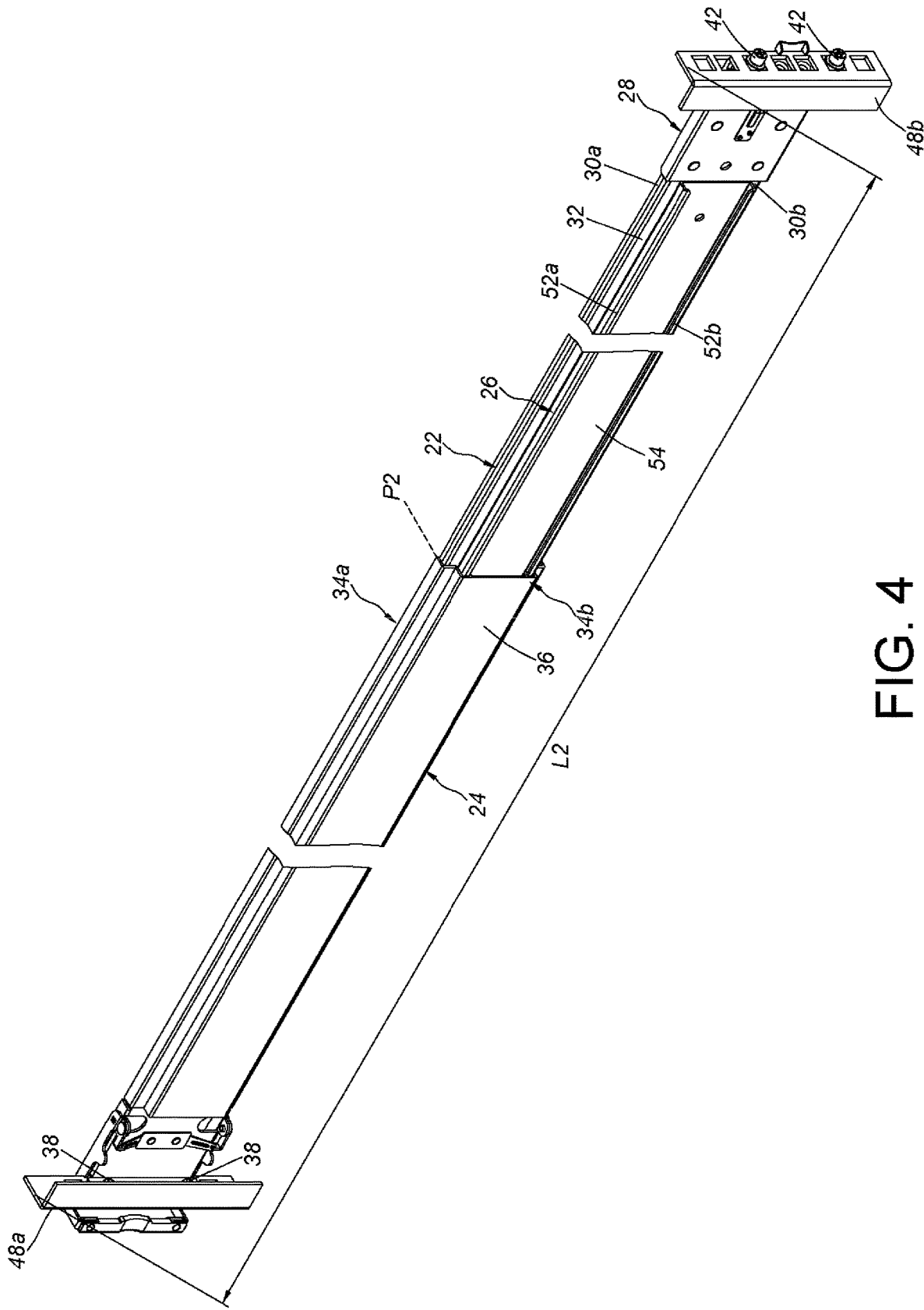
FIG. 4 is a diagram illustrating the slide rail mechanism being mounted on a rack with a second gap according to the first embodiment of the present invention.

As shown in FIG. 4, the first bracket 24 is movable along a length direction (a longitudinal direction) of the rail member 22 and the reinforcing member 26. For example, the first bracket 24 is able to be moved to a second position P2 from the first position P1 relative to the rail member 22, such that a second distance is formed between the first bracket 24 and the second bracket 28, in order to correspond to a second gap L2 between the first post 48a and the second post 48b. The second distance is greater than the first distance.

Figure 5:
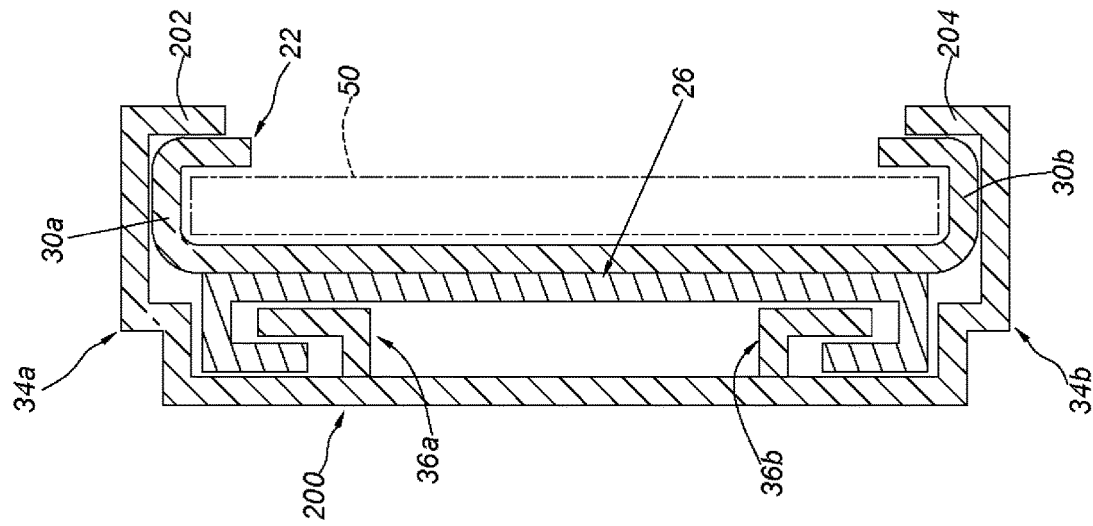
FIG. 5 is a cross-sectional view illustrating a rail member, a reinforcing member and a first bracket of the slide rail mechanism according to the first embodiment of the present invention.

As shown in FIG. 5, the reinforcing member 26 is arranged between the rail member 22 and the first bracket 24. The first bracket 24 partially clads the rail member 22 and the reinforcing member 26. When the first bracket 24 is moved to an arbitrary position relative to the rail member 22 (please refer to the first position P1 in FIG. 3 or the second position P2 in FIG. 4), the first bracket 24, the rail member 22 and the reinforcing member 26 are able to support each other.

Preferably, a passage 51 is defined by the first rail portion 30a, the second rail portion 30b and the longitudinal body 32. The longitudinal body 32 of the rail member 22 has a first side S1 and a second side S2 opposite to the first side S1. The first side S1 is located out of the passage 51, and the second side S2 is located in the passage 51. Wherein, the reinforcing member 26 is connected to the first side S1 to improve the structural strength of the rail member 22. On the other hand, the slide rail mechanism further includes at least one moving rail 50 movably mounted on the passage 51 of the rail member 22.

Preferably, the reinforcing member 26 includes a first wall portion 52a, a second wall portion 52b and a longitudinal wall 54 connected between the first wall portion 52a and the second wall portion 52b. It is noticed that the first wall portion 52a and the second wall portion 52b are respectively connected to opposite sides of the longitudinal wall 54 according to the embodiment of the present invention in FIG. 5. In another embodiment, the reinforcing member 26 can include just one of the first wall portion 52a and the second wall portion 52b. Selecting the first wall portion 52a or the second wall portion 52b depends on specific requirements. Hereinafter, it is illustrative of an example that the reinforcing member 26 includes a first wall portion 52a and a second wall portion 52b according to the embodiment of the present invention.

Preferably, the longitudinal supporting portion 36 of the first bracket 24 further includes a first extension portion 36a. The first extension portion 36a and one of the first wall portion 52a and the second wall portion 52b of the reinforcing member 26 are able to support each other. Hereinafter, it is illustrative of an example that the first extension portion 36a and the first wall portion 52a of the reinforcing member 26 are able to support each other.

Preferably, the longitudinal supporting portion 36 of the first bracket 24 further includes a second extension portion 36b. The second extension portion 36b and one of the first wall portion 52a and the second wall portion 52b of the reinforcing member 26 are able to support each other. Hereinafter, it is illustrative of an example that the second extension portion 36b and the second wall portion 52b of the reinforcing member 26 are able to support each other.

Preferably, the first wall portion 52a of the reinforcing member 26 includes a first wall section X1 and a second wall section X2 bent relative to the first wall section X1. A space 56 is defined by the first wall section X1 and the second wall section X2. On the other hand, the first extension portion 36a of the first bracket 24 includes a first extension section T1 and a second extension section T2 bent relative to the first extension section T1. The second extension section T2 is extended into the space 56 of the first wall portion 52a of the reinforcing member 26. The longitudinal supporting portion 36 of the first bracket 24 and the first wall portion 52a of the reinforcing member 26 are able to support each other. Preferably, the longitudinal supporting portion 36 of the first bracket 24 and the first wall portion 52a of the reinforcing member 26 are able to support each other through the second extension section T2.

Preferably, the second wall portion 52b of the reinforcing member 26 includes a third wall section X3 and a fourth wall section X4 bent relative to the third wall section X3. A space 58 is defined by the third wall section X3 and the fourth wall section X4. On the other hand, the second extension portion 36b of the first bracket 24 includes a third extension section T3 and a fourth extension section T4 bent relative to the third extension section T3. The fourth extension section T4 is extended into the space 58 of the second wall portion 52b of the reinforcing member 26. The longitudinal supporting portion 36 of the first bracket 24 and the second wall portion 52b of the reinforcing member 26 are able to support each other. Preferably, the longitudinal supporting portion 36 of the first bracket 24 and the second wall portion 52b of the reinforcing member 26 are able to support each other through the fourth extension section T4. In addition, in the present embodiment, the first extension section T1 of the first extension portion 36a of the longitudinal supporting portion 36, the third extension section T3 of the second extension portion 36b of the longitudinal supporting portion 36, the first wall section X1 of the first wall portion 52a of the reinforcing member 26 and the third wall section X3 of the second wall portion 52b of the reinforcing member 26 are arranged along a width direction of the rail member 22 relative to each other. The second extension section T2 of the first extension portion 36a of the longitudinal supporting portion 36, the fourth extension section T4 of the second extension portion 36b of the longitudinal supporting portion 36, the second wall section X2 of the first wall portion 52a of the reinforcing member 26 and the fourth wall section X4 of the second wall portion 52b of the reinforcing member 26 are arranged along a height direction of the rail member 22 relative to each other.

Preferably, the first supporting portion 34a of the first bracket 24 includes a first supporting section K1, a second supporting section K2 and a first intermediate section M1 connected between the first supporting section K1 and the second supporting section K2. Wherein, a step difference is formed between the first supporting section K1 and the second supporting section K2 by the first intermediate section M1. In other words, the first intermediate section M1 is substantially perpendicular to the first supporting section K1 and the second supporting section K2. The first supporting section K1 of the first bracket 24 and the first rail portion 30a of the rail member 22 are able to support each other. The second supporting section K2 of the first bracket 24 and the first wall portion 52a of the reinforcing member 26 are able to support each other. It is noticed that the first supporting portion 34a includes the first supporting section K1 and the first intermediate section M1 according to the embodiment of the present invention in FIG. 5. In another embodiment, the first supporting portion 34a of the first bracket 24 can only includes the second supporting section K2. The arrangement of the first supporting section K1, the second supporting section K2 and the first intermediate section M1 depends on specific requirements. Hereinafter, it is illustrative of an example that the first supporting portion 34a of the first bracket 24 includes the first supporting section K1, the second supporting section K2 and the first intermediate section M1. On the other hand, the second supporting portion 34b of the first bracket 24 includes a third supporting section K3, a fourth supporting section K4 and a second intermediate section M2 connected between the third supporting section K3 and the fourth supporting section K4. Wherein, a step difference is formed between the third supporting section K3 and the fourth supporting section K4 by the second intermediate section M2. The third supporting section K3 of the first bracket 24 and the second rail portion 30b of the rail member 22 are able to support each other. The fourth supporting section K4 of the first bracket 24 and the second wall portion 52b of the reinforcing member 26 are able to support each other.

According the slide rail mechanism of the first embodiment of the present invention, when the first bracket 24 is moved and adjusted to an arbitrary position, the first bracket 24, the rail member 22 and the reinforcing member 26 are able to support each other. Preferably, the first supporting portion 34a of the first bracket 24 and the first rail portion 30a of the rail member 22 are able to support each other. The second supporting portion 34b of the first bracket 24 and the second rail portion 30b of the rail member 22 are able to support each other. The reinforcing member 26, the longitudinal supporting portion 36 of the first bracket 24 and the longitudinal body 32 of the rail member 22 are able to support each other, in order to improve the structural strength of the slide rail mechanism.

Figure 6:
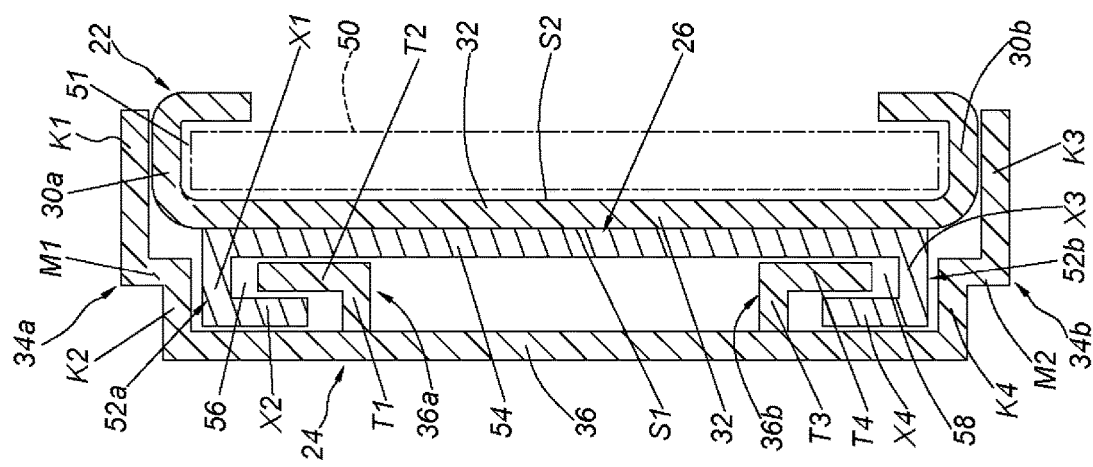
FIG. 6 is a cross-sectional view illustrating a rail member, a reinforcing member and a first bracket of a slide rail mechanism according to a second embodiment of the present invention.

As shown in FIG. 6, FIG. 6 is a cross-sectional view illustrating the rail member 22, the reinforcing member 26 and a first bracket 200 of a slide rail mechanism according to a second embodiment of the present invention. The difference between the slide rail mechanism of the second embodiment and the slide rail mechanism of the first embodiment is that: The first supporting portion 34a of the first bracket 200 further includes a first bending section 202, and the first banding section 202 and a lateral side of the first rail portion 30a of the rail member 22 are able to support each other. Preferably, the second supporting portion 34b of the first bracket 200 further includes a second bending section 204. The second bending section 204 and a lateral side of the second rail portion 30b of the rail member 22 are able to support each other.

According to above arrangement, compared to the first embodiment of the present invention, the first bracket 200 of the second embodiment and the lateral side of the first rail portion 30a of the rail member 22 are able to support each other through the first banding section 202, and the first bracket 200 and the lateral side of the second rail portion 30b of the rail member 22 are able to support each other through the second bending section 204. As such, the support reliability of the rail member 22, the first bracket 200 and the reinforcing member 26 is improved, and the structural strength of the slide rail mechanism is also improved.

As shown in FIG. 7, FIG. 7 is a cross-sectional view illustrating a rail member 22, a reinforcing member 26 and a first bracket 300 of a slide rail mechanism according to a third embodiment of the present invention. The difference between the slide rail mechanism of the third embodiment and the slide rail mechanism of the second embodiment is that: A longitudinal supporting portion 301 of the first bracket 300 does not include the first extension portion 36a and the second extension portion 36b.

Wherein, the same part between the slide rail mechanism of the third embodiment and the slide rail mechanism of the second embodiment is the first wall portion 52a of the reinforcing member 26 including the first wall section X1 and the second wall section X2 bent relative to the first wall section X1, and the second wall portion 52b of the reinforcing member 26 including the third wall section X3 and the fourth wall section X4 bent relative to the third wall section X3.

The first supporting portion 34a of the first bracket 300 includes the first supporting section K1, the second supporting section K2 and the first intermediate section M1 connected between the first supporting section K1 and the second supporting section K2. The first supporting section K1 of the first bracket 300 and the first rail portion 30a of the rail member 22 are able to support each other, and the second supporting section K2 of the first bracket 300 and the first wall portion 52a of the reinforcing member 26 are able to support each other. On the other hand, the second supporting portion 34b of the first bracket 300 includes the third supporting section K3, the fourth supporting section K4 and the second intermediate section M2 connected between the third supporting section K3 and the fourth supporting section K4. The third supporting section K3 of the first bracket 300 and the second rail portion 30b of the rail member 22 are able to support each other, and the fourth supporting section K4 of the first bracket 300 and the second wall portion 52b of the reinforcing member 26 are able to support each other. The longitudinal supporting portion 301 of the first bracket 300 and the second wall section X2 of the first wall portion 52a of the reinforcing member 26 are able to support each other, and the longitudinal supporting portion 301 of the first bracket 300 and the fourth wall section X4 of the second wall portion 52b of the reinforcing member 26 are able to support each other.

A first bending section 302 of the first supporting portion 34a of the first bracket 300 and the lateral side of the first rail portion 30a of the rail member 22 are able to support each other. Preferably, a second bending section 304 of the second supporting portion 34b of the first bracket 300 and the lateral side of the second rail portion 30b of the rail member 22 are able to support each other.

According to the above arrangement, the reinforcing member 26, the first bracket 300 and the rail member 22 of the third embodiment of the present invention are able to support each other, such that the structural strength of the slide rail mechanism are also improved.

As shown in FIG. 8, FIG. 8 is a cross-sectional view illustrating the rail member 22, the reinforcing member 26 and a first bracket 400 of the slide rail mechanism according to a fourth embodiment of the present invention. The difference between the slide rail mechanism of the fourth embodiment and the slide rail mechanism of the third embodiment is that: A first supporting portion 402 of the first bracket 400 does not include the first intermediate section M1, and a second supporting portion 404 of the first bracket 400 does not include the second intermediate section M2.

Furthermore, the first bracket 400 is arranged substantially horizontal through the first supporting portion 402 and the second supporting portion 404, and the first bracket 400 and the first rail portion 30a and the second rail portion 30b of the rail member 22 are able to support each other respectively. In addition, a first bending section 406 of the first supporting portion 402 of the first bracket 400 and the lateral side of the first rail portion 30a of the rail member 22 are able to support each other. A second bending section 408 of the second supporting portion 404 of the first bracket 400 and the lateral side of the second rail portion 30b of the rail member 22 are able to support each other.

According to the above arrangement, the reinforcing member 26, the first bracket 400 and the rail member 22 of the fourth embodiment of the present invention are able to support each other, such that the structural strength of the slide rail mechanism are also improved.

Figure 9:
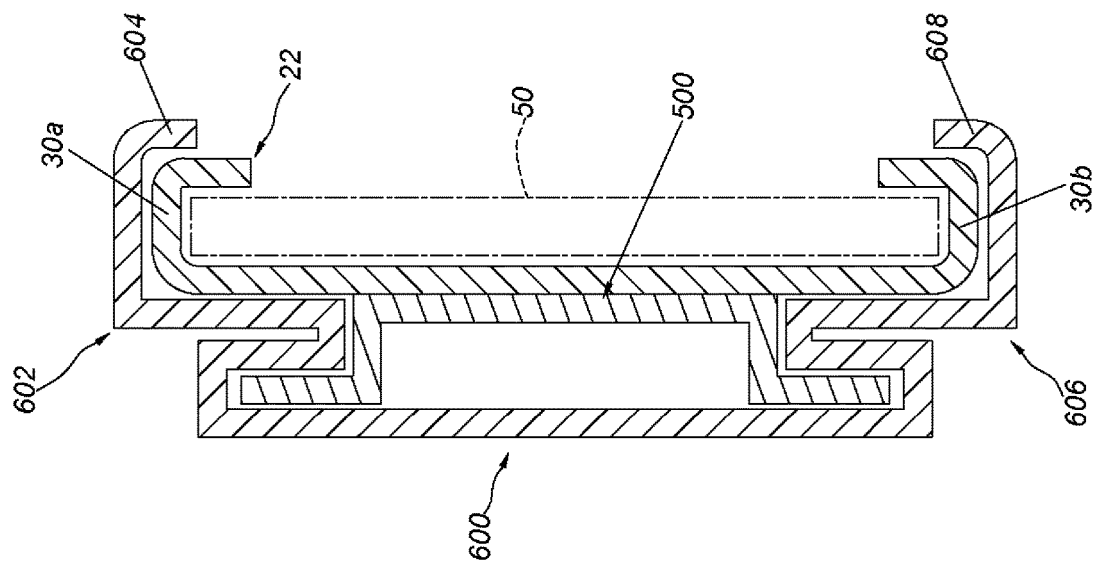
FIG. 9 is a cross-sectional view illustrating a rail member, a reinforcing member and a first bracket of a slide rail mechanism according to a fifth embodiment of the present invention.

As shown in FIG. 9, FIG. 9 is a cross-sectional view illustrating the rail member 22, a reinforcing member 500 and a first bracket 502 of the slide rail mechanism according to a fifth embodiment of the present invention. The difference between the slide rail mechanism of the fifth embodiment and the slide rail mechanisms of the first to the fourth embodiment is that: a first supporting portion 504 of the first bracket 502 includes a plurality of first intermediate sections 506 connected between a first supporting section 508 and a second supporting section 510, and/or a second supporting portion 512 of the first bracket 502 includes a plurality of second intermediate sections 514 connected between a third supporting section 516 and a fourth supporting section 518.

Wherein, the plurality of first intermediate sections 506 are bent to be folded relative each other, and the plurality of second intermediate sections 514 are also bent to be folded relative each other. According to the above arrangement, the structural strength of the rail member 22, the reinforcing member 500 and the first bracket 502 supporting each other is improved.

Furthermore, a first wall portion 520a of the reinforcing member 500 includes a first wall section Y1 and a second wall section Y2 bent relative to the first wall section Y1. A space 522 is defined by the first wall section Y1 and the second wall section Y2. A second wall portion 520b of the reinforcing member 500 includes a third wall section Y3 and a fourth wall section Y4 bent relative to the third wall section Y3. A space 524 is define by the third wall section Y3 and the fourth wall section Y4.

The plurality of first intermediate sections 506 of the first bracket 502 are connected between the first supporting section 508 and the second supporting section 510. The first supporting section 508 of the first bracket 502 and the first rail portion 30a of the rail member 22 are able to support each other. A longitudinal supporting portion 503 of the first bracket 502 and the first wall portion 520a of the reinforcing member 500 are able to support each other. Preferably, the second supporting section 510 of the first bracket 502 and the first wall portion 520a of the reinforcing member 500 are able to support each other, and the plurality of first intermediate sections 506 are extended into the space 522 of the first wall portion 520a of the reinforcing member 500, to further improve the structural strength of the reinforcing member 500 and the rail member 22.

The plurality of second intermediate sections 514 of the first bracket 502 are connected between the third supporting section 516 and the fourth supporting section 518. The third supporting section 516 of the first bracket 502 and the second rail portion 30b and the rail member 22 are able to support each other. The longitudinal supporting portion 503 of the first bracket 502 and the second wall portion 520b of the reinforcing member 500 are able to support each other. Preferably, the fourth supporting section 518 of the first bracket 502 and the second wall portion 520b of the reinforcing member 500 are able to support each other, and the plurality of second intermediate sections 514 are extended into the space 524 of the second wall portion 520b of the reinforcing member 500, to further improved the structural strength of the reinforcing member 500 and the rail member 22.

According to the above arrangement, the reinforcing member 500, the first bracket 502 and the rail member 22 of the fifth embodiment of the present invention are able to support each other, such that the structural strength of the slide rail mechanism are also improved.

Figure 10:
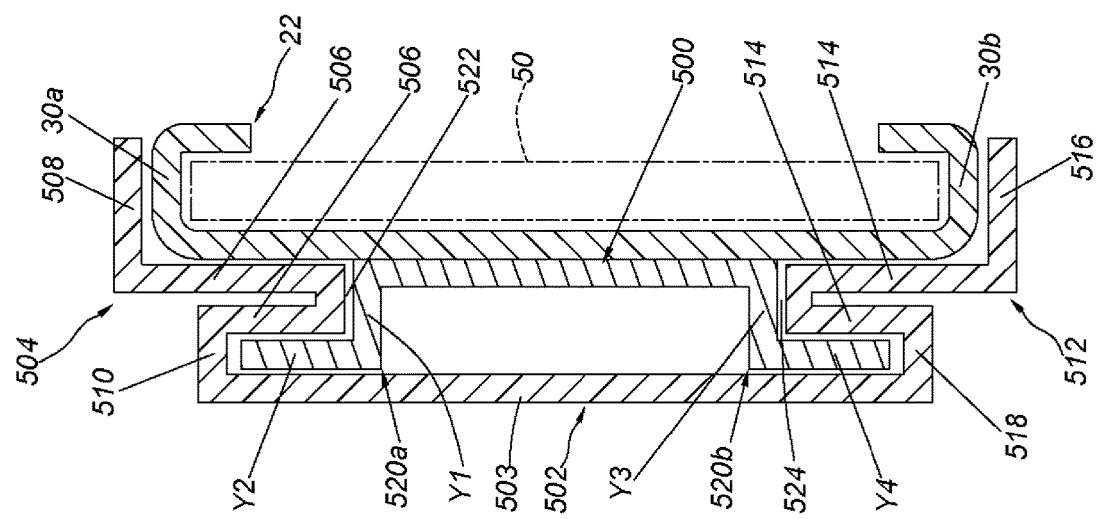
FIG. 10 is a cross-sectional view illustrating a rail member, a reinforcing member and a first bracket of a slide rail mechanism according to a sixth embodiment of the present invention.

As shown in FIG. 10, FIG. 10 is a cross-sectional view illustrating the rail member 22, the reinforcing member 500 and a first bracket 600 of the slide rail mechanism according to a sixth embodiment of the present invention. The difference between the slide rail mechanism of the sixth embodiment and the slide rail mechanisms of the fifth embodiment is that: a first supporting portion 602 of the first bracket 600 includes a first bending section 604, and the first bending section 604 and the lateral side of the first rail portion 30a of the rail member 22 are able to support each other. A second supporting portion 606 of the first bracket 600 includes a second bending section 608, and the second bending section 608 and the lateral side of the second rail portion 30b of the rail member 22 are able to support each other.

According to above arrangement, compared to the fifth embodiment of the present invention, the first bracket 600 of the sixth embodiment and the lateral side of the first rail portion 30a of the rail member 22 are able to support each other through the first banding section 604, and the first bracket 600 and the lateral side of the second rail portion 30b of the rail member 22 are able to support each other through the second bending section 608. As such, the support reliability of the rail member 22, the first bracket 600 and the reinforcing member 500 is improved, and the structural strength of the slide rail mechanism is also improved.

Compared to the prior art, the slide rail mechanisms according to all embodiments of the present invention have advantages over the prior art by the following perspectives (hereinafter, taking the first embodiment as an example):

1. When the first bracket 24 is moved to an arbitrary position (such as the first position P1 or the second position P2), the first bracket 24, the rail member 22 and the reinforcing member 26 are able to support each other.

2. When the first bracket 24 is moved to an arbitrary position, the first supporting portion 34a of the first bracket 24 and the first rail portion 30a of the rail member 22 are able to support each other. The second supporting portion 34b of the first bracket 24 and the second rail portion 30b of the rail member 22 are able to support each other, and the reinforcing member 26, the longitudinal supporting portion 36 of the first bracket 24 and the longitudinal body 32 of the rail member 22 are able to support each other. According to above arrangement, the structural strength of the slide rail mechanism can be improved.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A slide rail mechanism, comprising:
   a rail member comprising a first rail portion, a second rail portion and a longitudinal body connected between the first rail portion and the second rail portion;
   a first bracket movable relative to the rail member and comprising a first supporting portion, a second supporting portion and a longitudinal supporting portion connected between the first supporting portion and the second supporting portion; and
   a reinforcing member arranged between the rail member and the first bracket, the reinforcing member comprising a first wall portion, a second wall portion and a longitudinal wall connected between the first wall portion and the second wall portion;
   wherein when the first bracket is moved and adjusted to an arbitrary position, the first bracket, the rail member and the reinforcing member support each other;
   wherein the longitudinal supporting portion of the first bracket further comprises a first extension portion, the first extension portion and one of the first wall portion and the second wall portion of the reinforcing member are able to support each other;
   wherein the longitudinal supporting portion of the first bracket further comprises a second extension portion, the second extension portion and the other one of the first wall portion and the second wall portion of the reinforcing member are able to support each other;

wherein the first wall portion of the reinforcing member comprises a first wall section and a second wall section bent relative to the first wall section, a space is defined by the first wall section and the second wall section, the first extension portion of the first bracket comprises a first extension section and a second extension section bent relative to the first extension section, the second extension section is extended into the space of first wall portion, the second wall portion of the reinforcing member comprises a third wall section and a fourth wall section bent relative to the third wall section, a space is defined by the third wall section and the fourth wall section, the second extension portion of the first bracket comprises a third extension section and a fourth extension section bent relative to the third extension section, the fourth extension section is extended into the space of the second wall portion.

2. The slide rail mechanism of claim 1, wherein the first bracket is arranged adjacent to a first end portion of the rail member, the first bracket comprises a first mounting portion, the slide rail mechanism further comprises a second bracket arranged adjacent to a second end portion of the rail member, the second bracket comprises a second mounting portion, the first mounting portion of the first bracket is configured to mount the rail member to a first post, the second mounting portion of the second bracket is configured to mount the rail member to a second post.

3. The slide rail mechanism of claim 1, wherein the rail member has a first side and a second side, the reinforcing member is connected to the first side, the slide rail mechanism further comprises at least one moving rail movably mounted on the second side.

4. The slide rail mechanism of claim 1, wherein the first supporting portion of the first bracket comprises a first supporting section, a second supporting section and a first intermediate section connected between the first supporting section and the second supporting section, the first supporting section of the first bracket and the first rail portion of the rail member are able to support each other, the second supporting section of the first bracket and the first wall portion of the reinforcing member are able to support each other, the second supporting portion of the first bracket comprises a third supporting section, a fourth supporting section and a second intermediate section connected between the third supporting section and the fourth supporting section, the third supporting section of the first bracket and the second rail portion of the rail member are able to support each other, the fourth supporting section of the first bracket and the second wall portion of the reinforcing member are able to support each other.

5. The slide rail mechanism of claim 4, wherein the first supporting portion of the first bracket further comprises a first bending section, the first bending section and a lateral side of the first rail portion of the rail member are able to support each other.

6. The slide rail mechanism of claim 5, wherein the second supporting portion of the first bracket further comprises a second bending section, the second bending section and a lateral side of the second rail portion of the rail member are able to support each other.

7. The slide rail mechanism of claim 1, wherein the first wall portion of the reinforcing member comprises a first wall section and a second wall section bent relative to the first wall section, the second wall portion of the reinforcing member comprises a third wall section and a fourth wall section bent relative to the third wall section.

8. The slide rail mechanism of claim 7, wherein the first supporting portion of the first bracket comprises a first supporting section, a second supporting section and a first intermediate section connected between the first supporting section and the second supporting section, the first supporting section of the first bracket and the first rail portion of the rail member are able to support each other, the second supporting section of the first bracket and the first wall portion of the reinforcing member are able to support each other.

9. The slide rail mechanism of claim 8, wherein the second supporting portion of the first bracket comprise a third supporting section, a fourth supporting section and a second intermediate section connected between the third supporting section and the fourth supporting section, the third supporting section of the first bracket and the second rail portion of the rail member are able to support each other, the fourth supporting section of the first bracket and the second wall portion of the reinforcing member are able to support each other.

10. The slide rail mechanism of claim 7, wherein the first supporting portion the first bracket further comprises a first bending section, the first bending section and a lateral side of the first rail portion of the rail member are able to support each other, the second supporting portion of the first bracket further comprises a second bending section, the second bending section and a lateral side of the second rail portion of the rail member are able to support each other.

11. The slide rail mechanism of claim 1, wherein the first wall portion of the reinforcing member comprises a first wall section and a second wall section bent relative to the first wall section, a space is defined by the first wall section and the second wall section, the second wall portion of the reinforcing member comprises a third wall section and a fourth wall section bent relative to the third wall section, a space is defined by the third wall section and the fourth wall section.

12. The slide rail mechanism of claim 11, wherein the first supporting portion of the first bracket comprises a first supporting section, a second supporting section and a plurality of first intermediate sections connected between the first supporting section and the second supporting section, the first supporting section of the first bracket and the first rail portion of the rail member are able to support each other, the second supporting section of the first bracket and the first wall portion of the reinforcing member are able to support each other, the plurality of first intermediate sections are extended into the space of the first wall portion of the reinforcing member.

13. The slide rail mechanism of claim 12, wherein the second supporting portion of the first bracket comprises a third supporting section, a fourth supporting section and a plurality of second intermediate sections connected between the third supporting section and the fourth supporting section, the third supporting section of the first bracket and the second rail portion of the rail member are able to support each other, the fourth supporting section of the first bracket and the second wall portion of the reinforcing member are able to support each other, the plurality of second intermediate sections are extended into the space of the second wall portion of the reinforcing member.

14. The slide rail mechanism of claim 13, wherein the first supporting portion of the first bracket further comprises a first bending section, the first bending section and a lateral side of the first rail portion of the rail member are able to support each other, the second supporting portion of the first bracket further comprises a second bending section, the second bending section and a lateral side of the second rail portion of the rail member are able to support each other.

15. A slide rail mechanism, comprising:
    a rail member comprising a first rail portion, a second rail portion and a longitudinal body connected between the first rail portion and the second rail portion;
    a first bracket movable relative to the rail member and comprising a first supporting portion, a second supporting portion and a longitudinal supporting portion connected between the first supporting portion and the second supporting portion; and
    a reinforcing member arranged between the rail member and the first bracket, the reinforcing member comprising a first wall portion, a second wall portion and a longitudinal wall connected between the first wall portion and the second wall portion;
    wherein when the first bracket is moved and adjusted to an arbitrary position, the first bracket, the rail member and the reinforcing member support each other;
    wherein the first wall portion of the reinforcing member comprises a first wall section and a second wall section bent relative to the first wall section, the second wall portion of the reinforcing member comprises a third wall section and a fourth wall section bent relative to the third wall section.

16. A slide rail mechanism, comprising:
    a rail member comprising a first rail portion, a second rail portion and a longitudinal body connected between the first rail portion and the second rail portion;
    a first bracket movable relative to the rail member and comprising a first supporting portion, a second supporting portion and a longitudinal supporting portion connected between the first supporting portion and the second supporting portion; and
    a reinforcing member arranged between the rail member and the first bracket, the reinforcing member comprising a first wall portion, a second wall portion and a longitudinal wall connected between the first wall portion and the second wall portion;
    wherein when the first bracket is moved and adjusted to an arbitrary position, the first bracket, the rail member and the reinforcing member support each other;
    wherein the first wall portion of the reinforcing member comprises a first wall section and a second wall section bent relative to the first wall section, a space is defined by the first wall section and the second wall section, the second wall portion of the reinforcing member comprises a third wall section and a fourth wall section bent relative to the third wall section, a space is defined by the third wall section and the fourth wall section.

* * * * *